Dec. 11, 1962 D. F. CICCOLELLA ET AL 3,067,485
SEMICONDUCTOR DIODE
Filed Aug. 13, 1958 2 Sheets-Sheet 1

INVENTORS: D. F. CICCOLELLA
J. H. FORSTER
R. L. RULISON
BY [signature]
ATTORNEY

INVENTORS: D. F. CICCOLELLA
J. H. FORSTER
R. L. RULISON
BY [signature]
ATTORNEY

United States Patent Office 3,067,485
Patented Dec. 11, 1962

3,067,485
SEMICONDUCTOR DIODE

David F. Ciccolella, Westfield, John H. Forster, Madison, and Raymond L. Rulison, Berkeley Heights, N.J., assignors to Bell Telephone Laboratories, Incorporated, New York, N.Y., a corporation of New York
Filed Aug. 13, 1958, Ser. No. 754,894
4 Claims. (Cl. 29—25.3)

This invention relates to semiconductor devices of the type especially suitable for use as fast operating switches and to the processes for making such devices.

In electronic systems, for example, computers and telephone switching systems in which diodes are used to accomplish certain logic functions and the like, as shown in Patent 2,758,787 issued August 14, 1956, to J. H. Felker, the overall speed of operation of the system is, to a considerable extent, dependent upon the time required for the diodes to change from the low to the high impedance condition. To enable a rapid succession of logic operations, it is important that each individual diode assume a steady state condition of high impedance within a very short time after the bias voltage across the diode is changed from the forward to the reverse condition.

This time interval for semiconductor devices is termed the reverse recovery time and is largely a function of the lifetimes of minority current carriers in the semiconductive material. Thus, for use as high speed switches, semiconductor diodes advantageously should have uniformly low values of minority carrier lifetime and, as a consequence, very short reverse recovery time.

Therefore, an object of this invention is a semiconductive diode which eminently fulfills the foregoing requirements.

Another object of this invention is a process for making a silicon PN junction diode in which impurities are introduced by diffusion in a controllable manner to achieve both the desired types and values of conductivity and specified values of minority carrier lifetime.

Another object is a process for making high speed silicon PN junction diodes having uniformly low values of minority carrier lifetime.

More specifically, an object is a process for tailoring the minority carrier lifetime in silicon semiconductive devices to yield specified reverse recovery times and, in particular, short recovery times.

A specific embodiment of this invention comprises a wafer of single crystal silicon having a region of P-type conductivity material adjacent one face and of N-type conductivity material adjacent the other face and defining a PN junction therebetween. In accordance with techniques disclosed, for example, in United States Patents 2,802,760 and 2,804,405 to L. Derick and C. J. Frosch issued August 13, 1957, and August 27, 1957, respectively, such conductivity-type regions may be formed readily by the solid state diffusion of significant impurities, for example, boron and phosphorus.

Further, in accordance with this invention a substantially uniform concentration of electrically active gold atoms is dispersed throughout the semiconductive wafer in both P and N-type conductivity portions. That is, a gold dispersion is effected which results in a substantially uniform distribution of recombination centers and thereby a substantially uniform minority carrier lifetime within each conductivity-type region. In particular, the gold is introduced by solid state diffusion under conditions such that a substantially uniform dispersion is produced at a concentration level determined primarily by the diffusion temperature.

More specifically, the silicon semiconductive body is coated with gold or gold-containing material, for example, by electroplating. The silicon is then heated at a temperature in the range from approximately 800 degrees centigrade to approximately 1300 degrees centigrade for a period of time sufficient to achieve substantially complete solid solubility of the gold in the silicon at the temperature employed. The reverse recovery time of the devices decreases as the temperature of gold diffusion increases. The introduction of gold provides additional recombination centers in the silicon which act to reduce the minority carrier lifetimes therein and, as a consequence, to decrease the reverse recovery time. Advantageously, the gold diffusion is accomplished at a temperature and for a time which does not affect adversely the impurity gradients already present in the silicon as a result of the earlier diffusion of significant impurities, such as boron and phosphorus. Specifically, in this respect, the use of gold for lifetime treatment in combination with boron and phosphorus as significant impurity diffusants is particularly advantageous because of their respective diffusion constants.

Thus, gold, which is known to reduce minority carrier lifetime in silicon, is introduced in a controlled fashion to enable the fabrication of silicon semiconductor diodes, all of which may have reverse recovery times within a specified range including, insofar as applicants are aware, hitherto unattained low values.

As a matter of definition herein, the reverse recovery time, $t_{rr}$, of a semiconductor diode is measured under the following conditions. The diode is biased to a forward current having a value $I_f$. A reverse bias pulse is applied at a time $t_0$ and the circuit is such that the diode initially conducts a value of reverse current, $I_{r0}$, equal in magnitude to $I_f$. The time dependence of the reverse current is measured on an oscilloscope and the time, measured from $t_0$, required for the magnitude of the current to fall to one-tenth of $I_{r0}$ is defined as the reverse recovery time, $t_{rr}$.

Next, the silicon wafer, including a PN junction and a uniform dispersion of gold therethrough, is plated on both faces to provide low resistance contact to both P- and N-type regions. Then the wafer is shaped to reduce the junction area, and thereby the junction capacitance, by forming a small central raised portion or mesa on one face. The device is then completed by attaching suitable leads and incorporating the assembly in a protective housing or encapsulation.

In certain semiconductor devices it may be desirable to limit or localize the gold treatment, thus reducing the minority carrier lifetime within only a portion of the semiconductor body. Such structures may be achieved by using suitable masks or by controlling the depth of gold diffusion by limiting the time of diffusion. In such circumstances, however, the benefit of control of the gold concentration by effecting complete solid solubility within the entire silicon body is not necessarily realized to the extent possible when the gold is diffused through the entire volume in accordance with this invention.

Thus, a feature of this invention is a silicon semiconductor diode having a substantially uniform distribution of electrically active gold atoms throughout the semiconductive body to reduce the minority carrier lifetime.

A further feature of this invention is a method for providing a specified level of substantially uniform concentration of electrically active gold atoms throughout a body of silicon semiconductive material.

A better understanding of the invention and its further objects and features will be obtained from the following more detailed explanation taken in connection with the drawing in which.

Figure 1:
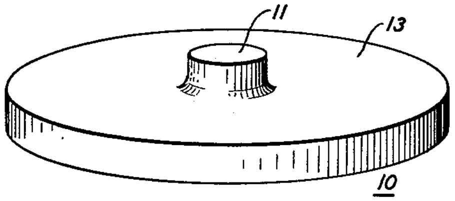
FIGS. 1 and 2 are, respectively, perspective end cross-sectional views of a semiconductive wafer for fabricating a PN junction diode in accordance with this invention.
Figure 2:
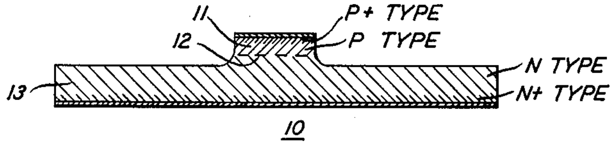

FIGS. 1 and 2 show a silicon semiconductive wafer 10 which is circular in shape and has a raised portion or mesa 11 on one face. As best shown in FIG. 2, the wafer contains a PN junction 12 near the base of the mesa portion of the wafer. The surface regions of the wafer are of more highly conductive material indicated by the P+ and N+ designations to facilitate the application of low resistance electrodes. These electrodes are shown in the form of metallic coatings, for example, gold on the opposite faces of the wafer.

Figure 3:
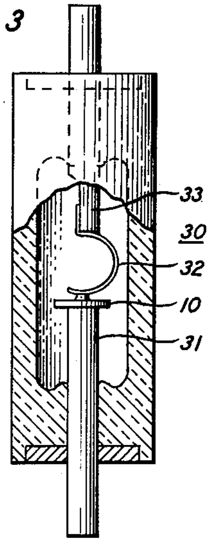
FIG. 3 illustrates the diode in a typical encapsulating arrangement.

Typically, a semiconductive body of the type shown in FIGS. 1 and 2 comprises a wafer having a diameter of about .030 inch and a thickness over the main portion 13 of about .0045 inch. The centrally located mesa portion 11, typically, has a diameter of .005 inch, which in some cases may be as small as .002 inch, and a height of about .0025 inch. Referring to FIG. 2, the PN junction 12 is located at a depth of about .0015 inch from the upper surface of the mesa. The semiconductive body 10 of FIGS. 1 and 2 containing a PN junction 12 produced by solid state diffusion contains also a substantially uniform dispersion of gold atoms likewise produced by solid state diffusion, as will be more fully explained hereinafter. This semiconductive body is suitably mounted and enclosed in a standard encapsulation, for example, of the type shown in FIG. 3 which includes a substantially all-glass housing. The device thus illustrated in FIG. 3 is suitable from the standpoint of electrical characteristics and reverse recovery time for use in a variety of computer, and the like, applications.

Figure 4:
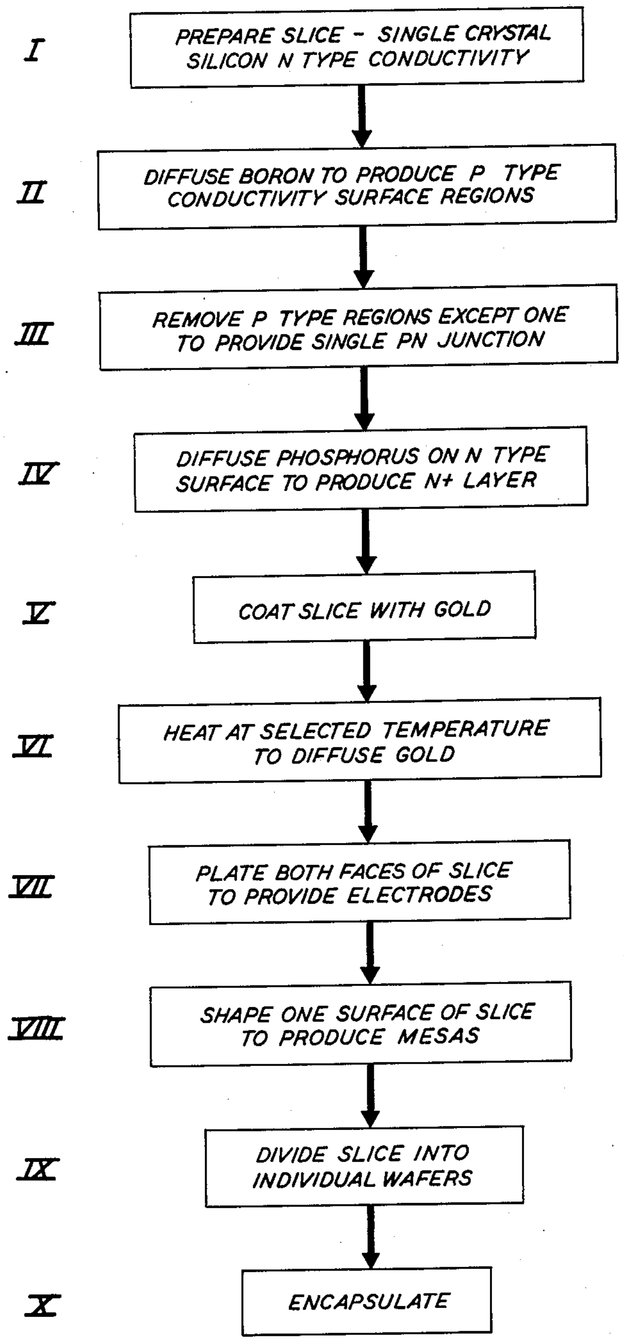
FIG. 4 is a diagrammatic representation of the process in accordance with this invention.

More specifically, the process for fabricating the diode illustrated in the foregoing-noted figures is set forth diagrammatically in FIG. 4. As a first step, identified by I, a relatively large slice of single crystal silicon of N-type conductivity is prepared generally by taking a transverse slice from a single crystal of silicon produced in any one of a number of ways well known in the art. Generally, the largest slice obtainable in this way will have a diameter of about one inch. This slice, having a resistivity of about .15 ohm centimeters is prepared by conventional lapping and chemical cleaning techniques so as to have two substantially parallel faces on a slice having a thickness of about .010 inch. From this slice a relatively large number of the individual wafers similar to the one shown in FIGS. 1 and 2 are fabricated, as explained hereinafter.

In Step II, the slice is subjected to a solid state diffusion of boron to produce a P-type conductivity layer on both faces of the slice to a depth of about .0015 inch. This diffusion process may be carried out in any one of a number of ways, for example, by heating in a gaseous atmosphere which includes elemental boron, or by coating a surface of the slice with a material such as a suspension containing a compound of boron. These and other methods are disclosed in United States Patents of Derick and Frosch noted hereinbefore, as well as the application of C. S. Fuller, Serial No. 414,272, filed March 5, 1954 now Patent No. 3,015,590 issued January 2, 1962. This diffusion step is carried out in accordance with techniques known in the art at an elevated temperature and for a time sufficient to produce the desired depth of diffusion. More specifically, an N-type silicon slice was coated with a solution composed of 20 grams of boric acid anhydride in 100 cubic centimeters of ethylene glycol monomethyl ether and heated at a temperature of about 1230 degrees centigrade for about 16 hours in air to convert the slice to P-type conductivity to a depth of .0015 inch.

In accordance with Step III, the slice is mechanically lapped or chemically etched to reduce the thickness of the slice more nearly to the final dimensions and to remove, in the case where a P-type region is formed on both surfaces, one of the P-type surface layers. Thus, the slice is reduced to a thickness of about .007 inch with a PN junction at a depth of about .0015 inch from the P-type surface of the slice.

As indicated in Step IV of the diagram, a degenerate or highly N-type (N+) region is formed at the surface of the N-type conductivity layer by coating that surface with a solution composed of 4 grams of phosphorus pentoxide and 80 cubic centimeters of ethylene glycol monomethyl ether and heating the slice in air at about 1100 degrees centigrade for about two hours. This results in an approximately .0002 inch thick N+ layer corresponding to the P+ layer produced near the surface of the opposite face of the slice as a result of the diffusion heat treatment. These higher conductivity regions facilitate the attachment of low resistance electrodes to both conductivity-type regions.

The slice is then coated with a thin layer of gold, as indicated by Step V. This may be accomplished by any one of a variety of methods including electroplating, evaporation deposition, or by spraying or painting a gold solution on the slice. Only a relatively thin layer of gold is required to provide an ample source for diffusing the silicon slice. Typically, an electroplating from a gold cyanide solution for about three minutes at a current of 10 milliamperes per square inch is sufficient to produce a scarcely visible coating of gold of the order of $10^{-5}$ inches in thickness which is sufficient for the method of this invention.

Figure 5:
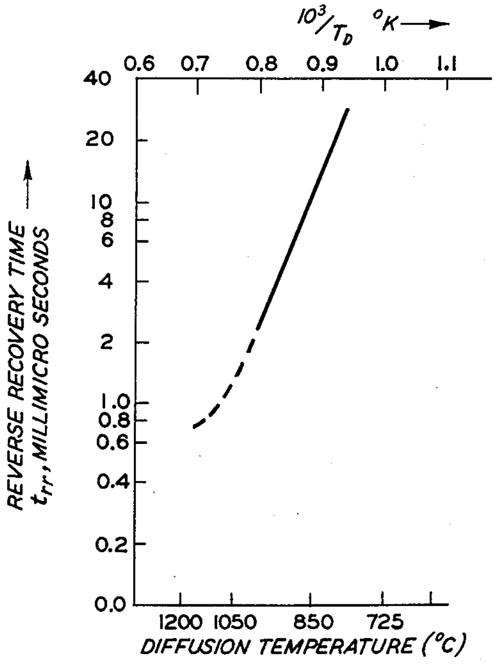
FIG. 5 is a graph relating reverse recovery time to diffusion temperature.

Next, as shown in Step VI, the slice is heated in a diffusion furnace containing a nitrogen atmosphere at a temperature of about 1100 degrees centigrade for about one hour. Generally, gold diffuses rather rapidly at higher temperatures. For silicon slices of about .007 to .010 inch thickness, the minimum diffusion times to ensure complete gold solubility are about 15 minutes at 1300 degrees centigrade, about one hour at 1100 degrees centigrade, and approximately 16 hours at 800 degrees centigrade. These are minimum times and may be exceeded by fifty to one hundred percent without deleterious effect. This diffusion results in a substantially uniform distribution of electrically active gold atoms throughout the entire slice. The concentration level of this uniform distribution is generally dependent upon the temperature of the diffusion treatment assuming a more than sufficient source of gold for diffusion. Referring to the graph of FIG. 5, there is shown the relation between the reverse recovery time and the temperature at which the gold diffusion is accomplished. The lower non-linear scale is the diffusion temperature in degrees centigrade derived from the upper scale which indicates inverse degrees Kelvin. The ordinate is a semi-log plot of reverse recovery time ($t_{rr}$) in millimicroseconds which, as previously noted, is dependent upon the lifetime of the minority carriers. This lifetime, in turn, is dependent upon the density and nature of the recombination centers present. Generally, for switching diodes, useful reverse recovery times are realized using gold concentrations in the approximate range from $10^{15}$ atoms per cubic centimeter to $10^{17}$ atoms per cubic centimeter. Thus, having selected the desired reverse recovery time, the temperature for the gold diffusion of Step VI is determined from the curve of FIG. 5. More specifically, for a recovery time close to one millimicrosecond, the necessary concentration of electrically active gold atoms is attained by a diffusion treatment as specified at a temperature of about 1100 degrees centigrade.

In accordance with Step VII, both faces of the slice are plated to provide low resistance electrode connections to the P and N-type regions of the slice. This plating operation conveniently is done before the slice is divided into wafers particularly if the subsequent shaping and cutting operations are accomplished by ultrasonic means. Specifically, gold and similar contact metals, such as are well-known in the art, may be applied by electroplating or other suitable means, for example, evaporation deposition. A standard gold cyanide bath is used to deposit a gold layer from 40 to 50 milligrams per square inch in thickness.

Next, in order to reduce the junction capacitance and thus, in another way, to enhance the switching speed of the semiconductive device, it is desirable to reduce the cross-sectional area of the PN junction to a minimum. At the same time, in order to provide a semiconductive body convenient for handling during fabrication, only a portion of the wafer is removed from one face to a depth slightly greater than the depth of the junction to produce the mesa portion of reduced diameter containing the PN junction.

It should be noted further that the gold diffusion treatment to reduce the minority carrier lifetime of the device has a further advantageous effect in that it also tends to reduce the concentration gradient in both conductivity-type regions and thereby reduces the junction capacitance. Both of the foregoing-noted effects of gold diffusion occur without other significant effect on the value of conductivity throughout the semiconductive body for material of sufficiently low resistivity. This is an important aspect of the invention because in certain alternative techniques for reducing minority carrier lifetime within a semiconductive body more deleterious side effects on both conductivity and other bulk characteristics can occur.

Thus, in accordance with Step VIII, an array of small mesas are formed on the P-type face of the slice. Advantageously, this step may be accomplished using ultrasonic cutting means to produce a regular array of the mesas. A cutting head suitable for this operation comprises a plate containing an array of holes corresponding in size and arrangement to the array of mesas.

In accordance with Step IX, the slice is then divided, also by ultrasonic cutting means, into individual circular wafers in accordance with the array of the mesas. Thus, a number of small semiconductive wafers, as depicted in FIGS. 1 and 2, are produced from a single slice of silicon material.

The individual wafer 10 may then be solder-mounted on the stud 31, as shown in the encapsulation 30 of FIG. 3. Contact is made to the mesa surface by means of the C spring pressure contact 32 mounted from the upper stud 33 of the encapsulation. The fabrication of this enclosure is generally in accordance with techniques well-known in the art and any one of a number of other suitable housings may be utilized.

It will be appreciated by those skilled in the art that the several diffusion treatments enumerated in the foregoing process may be carried out in a different succession or may be accomplished in a single step if the diffusion temperatures are within certain limits. Thus, in one alternative method the slice may be prepared in accordance with Step I of FIG. 4 and then coated first with a thin layer of gold followed by a coating of a boron diffusant on one face and a phosphorus diffusant on the opposite face. The entire slice is then heat treated in an inert or nitrogen atmosphere at a temperature of about 1250 degrees centigrade for a period of at least 12 hours. This process results in a PN junction at about the previously specified depth within the slice, degenerate layers on both surfaces of the slice and a substantially uniform dispersion of gold of the desired concentration throughout the entire slice. Although in the foregoing specific embodiments the gold has been applied in the form of a coating or the like on the silicon, the treatment may also be accomplished by providing a gold source in proximity to the material to be diffused.

A single step diffusion process in this fashion is possible only where the parameters of wafer thickness, conductivity, junction depth and final reverse recovery time are such as to enable a satisfactory structure with a single diffusion operation. Generally, a more precise control of the process is realized if the various diffusions are carried out in separate steps.

Although gold has clear advantages from the standpoint of availability, ease of application and contamination, it appears that other fast diffusing elements, for example, platinum, which may be coated on the silicon by sputtering, are also useful for providing a controlled degradation of minority carrier lifetime when diffused in single crystal silicon semiconductive material.

Iron and copper also are known to reduce minority carrier lifetime when present in silicon. Iron, however, has a solid solubility in silicon which changes rapidly with temperature and therefore is much less controllable than gold from the standpoint of attaining specified reverse recovery times. Copper is apparently less advantageous than gold for lifetime treatment of silicon because of its tendency to precipitate into enlarged "clumps" within the silicon. This effect makes control of the copper concentration more difficult. Furthermore, devices made using copper may tend to lose the electrical effectiveness of the lifetime treatment with the passage of time.

It is obvious that the foregoing embodiments are but illustrative of the general principles of the invention and that other arrangements may be made by those skilled in the art without departing from the scope and spirit of the invention.

What is claimed is:

1. In the process of fabricating a semiconductor translating device of the type suitable as a high speed switch the steps comprising preparing a wafer of single crystal stiicon of one conductivity, and heating said body at a temperature of the range from about 1000 degrees centigrade to 1300 degrees centigrade in the presence of gold and a significant impurity of the kind to induce the conductivity type opposite to said one conductivity type for a period of hours thereby to produce a PN junction in said body and to saturate all of said body with a substantially uniform concentration of electrically active gold atoms at said temperature.

2. The method in accordance with claim 1 in which the heat treatment to diffuse said significant impurity and the heat treatment to diffuse gold are successive separate steps.

3. In the process of fabricating a semiconductor diode suitable as a high speed switching device, the steps comprising preparing a wafe of N-type single crystal silicon, and heating said body in the presence of boron and gold at a temperature of from about 1000 degrees centigrade to 1300 degrees centigrade for a period of hours to convert a portion of said body to P-conductivity type and to saturate all of said body with a substantially uniform concentration of electrically active gold atoms at the heating temperature.

4. In the process of fabricating a semiconductor diode for use as a high speed switching device, the steps comprising preparing a wafer of N-type single crystal silicon having two substantially parallel main surfaces, applying a thin coating of gold to said body, coating one of said surfaces with a material containing boron and the other said surface with a material containing phosphorus, and heating said wafer at a temperature in the range of from about 1000 degrees centigrade to 1300 degrees centigrade for a period of hours thereby to convert a portion of said wafer adjacent said boron-coated surface to P-type conductivity, plating both surfaces of said wafer with metallic electrodes, and removing a peripheral portion of said wafer adjacent said P-type surface to a depth just below the PN junction thereby to reduce the area of said junction.

References Cited in the file of this patent

UNITED STATES PATENTS

| | | |
|---|---|---|
| 2,666,814 | Shockley | Jan. 19, 1954 |
| 2,701,326 | Pfann et al. | Feb. 1, 1955 |
| 2,750,542 | Armstrong et al. | June 12, 1956 |
| 2,833,969 | Christian | May 6, 1958 |
| 2,854,366 | Wannlund et al. | Sept. 30, 1958 |
| 2,859,140 | Clarke | Nov. 4, 1958 |
| 2,866,140 | Jones et al. | Dec. 23, 1958 |